(12) United States Patent
Oh et al.

(10) Patent No.: US 10,579,286 B2
(45) Date of Patent: Mar. 3, 2020

(54) MEMORY DEVICE AND RECLAIMING METHOD OF THE MEMORY DEVICE

(71) Applicant: SAMSUNG ELECTRONICS CO., LTD., Suwon-si, Gyeonngi-Do (KR)

(72) Inventors: Hee-Tai Oh, Seoul (KR); Walter Jun, Seoul (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 16/120,832

(22) Filed: Sep. 4, 2018

(65) Prior Publication Data

US 2019/0146688 A1 May 16, 2019

(30) Foreign Application Priority Data

Nov. 13, 2017 (KR) .................. 10-2017-0150280

(51) Int. Cl.
 *G06F 3/00* (2006.01)
 *G06F 3/06* (2006.01)
 *G11C 29/52* (2006.01)
 *G06F 11/10* (2006.01)

(52) U.S. Cl.
 CPC .......... *G06F 3/0619* (2013.01); *G06F 3/064* (2013.01); *G06F 3/0631* (2013.01); *G06F 3/0658* (2013.01); *G06F 3/0679* (2013.01); *G06F 11/1068* (2013.01); *G11C 29/52* (2013.01)

(58) Field of Classification Search
 None
 See application file for complete search history.

(56) References Cited

U.S. PATENT DOCUMENTS

| | | | |
|---|---|---|---|
| 7,173,852 | B2 | 2/2007 | Gorobets et al. |
| 8,286,501 | B2 | 10/2012 | Jeddeloh |
| 9,070,473 | B2 | 6/2015 | Bedeschi et al. |
| 9,378,830 | B2 | 6/2016 | Khoueir et al. |
| 9,690,654 | B2 | 6/2017 | No et al. |
| 2015/0355845 | A1 | 12/2015 | Lee et al. |
| 2016/0217032 | A1 | 7/2016 | Yum et al. |
| 2017/0185463 | A1 | 6/2017 | Kim et al. |

FOREIGN PATENT DOCUMENTS

KR 1020160091499 8/2016

*Primary Examiner* — Midys Rojas
(74) *Attorney, Agent, or Firm* — F. Chau & Associates, LLC

(57) ABSTRACT

A memory device includes a nonvolatile memory having a first block and a memory controller configured to exchange data with the nonvolatile memory. The memory controller includes a first processor to divide the first block into first and second domains, a second processor to generate a reclaim signal by determining whether to perform reclaiming on each of the first and second domains and a third processor performer which reclaims each of the first and second domains according to the reclaim signal and merges the first and second domains.

20 Claims, 9 Drawing Sheets

MEMORY DEVICE AND RECLAIMING METHOD OF THE MEMORY DEVICE

CROSS-REFERENCE TO RELATED APPLICATION

This application claims the benefit of and priority under 35 U.S.C. 119 to Korean Patent Application No. 10-2017-0150280, filed on Nov. 13, 2017, in the Korean Intellectual Property Office, the disclosure of which is incorporated by reference in its entirety herein.

BACKGROUND

1. Technical Field

The present inventive concept relates to a memory device and a reclaiming method of the memory device.

2. Discussion of Related Art

Data cannot be overwritten in a system using a nonvolatile memory. Instead, a block of data needs to be deleted before it can be used to store new data. The new data can be written to a new block without immediately deleting the old block, thereby preserving the valid data of the old block. However, a large amount of overhead is incurred in writing the new data and preserving the valid data of the old block.

In order to maintain the reliability of data at a specific physical address, a memory controller may transfer valid data at the specific physical address to another physical address. This is called "reclaiming." However, the more the reclaiming is performed, the worse the read performance of a memory becomes.

SUMMARY

At least one embodiment of the inventive concept provides a memory device having improved reliability of data and reduced frequency of reclaiming.

At least one embodiment of the inventive concept also provides a reclaiming method of a memory device to improve the reliability of data while reducing the frequency of reclaiming.

According to an exemplary embodiment the inventive concept, there is provided a memory device including a nonvolatile memory which has a first block and a memory controller which exchanges data with the nonvolatile memory. The memory controller includes a first processor which divides the first block into first and second domains, a second processor which generates a reclaim signal by determining whether to perform reclaiming on each of the first and second domains and a third processor which reclaims each of the first and second domains according to the reclaim signal and merges the first and second domains.

According to an exemplary embodiment of the inventive concept, there is provided a memory device including a nonvolatile memory which has a first data block, a first free block and a second free block and a memory controller which exchanges data with the nonvolatile memory. The memory controller divides the first block into first and second domains having first and second data, respectively, transfers the first data to the first free block, transfers the second data to the second free block, and merges the first and second data by transferring the first data to the second free block.

According to an exemplary embodiment of the inventive concept, there is provided a reclaiming method of a memory device. The method includes dividing a first block into first and second domains having first and second data, respectively, generating a reclaim signal by determining whether to reclaim each of the first and second domains, reclaiming the first domain according to the reclaim signal, reclaiming the second domain according to the reclaim signal, and merging the first domain and the second domain.

According to an exemplary embodiment of the inventive concept, a memory device includes a nonvolatile memory and a memory controller. The nonvolatile memory includes a first block having a plurality of pages, a second block, and a third block. The memory controller is configured to determine whether the pages include first pages having a data reliability less than a threshold, assign the first pages to a first domain, assign the remaining pages to a second domain, and perform a reclaim on the first pages during a first period and a reclaim on the remaining pages during a second period after the first period. The reclaim of the first pages includes copying the first pages from the first block to the second block. The reclaim of the remaining pages includes copying the remaining pages of the first block to the third block.

BRIEF DESCRIPTION OF THE DRAWINGS

The inventive concept will become apparent and more readily appreciated from the following description of the exemplary embodiments, taken in conjunction with the accompanying drawings in which.

DETAILED DESCRIPTION

A memory device according to an exemplary embodiment of the inventive concept will now be described with reference to FIGS. 1 through 12.

Figure 1:
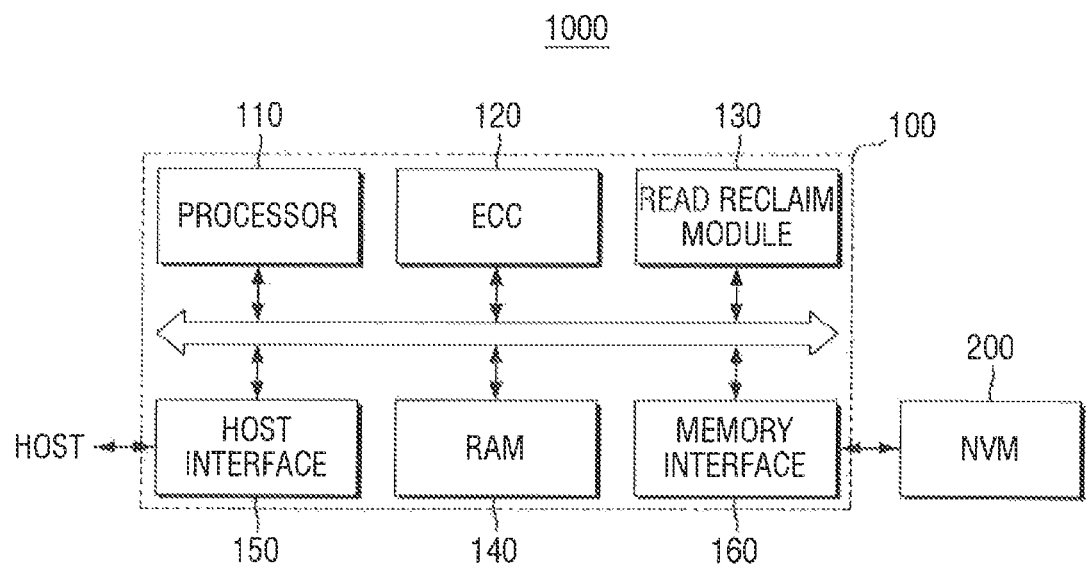
FIG. 1 is a block diagram of a memory device according to an exemplary embodiment of the inventive concept.
Figure 2:
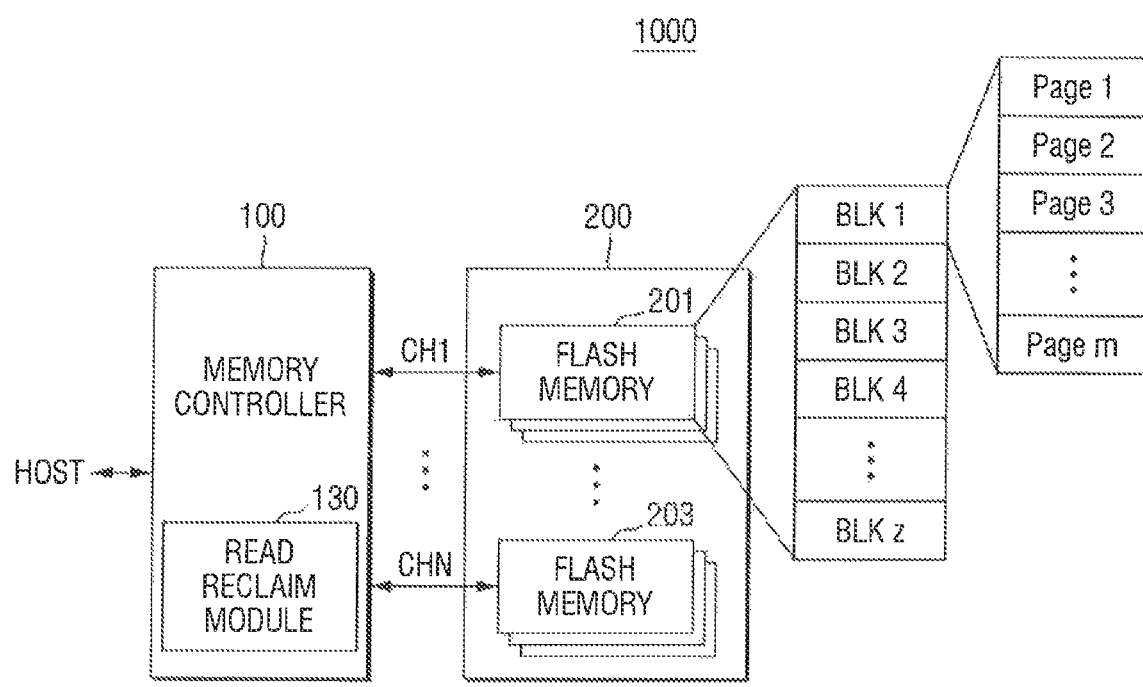
FIG. 2 is a block diagram of the memory device according to the embodiment of FIG. 1.
Figure 3:
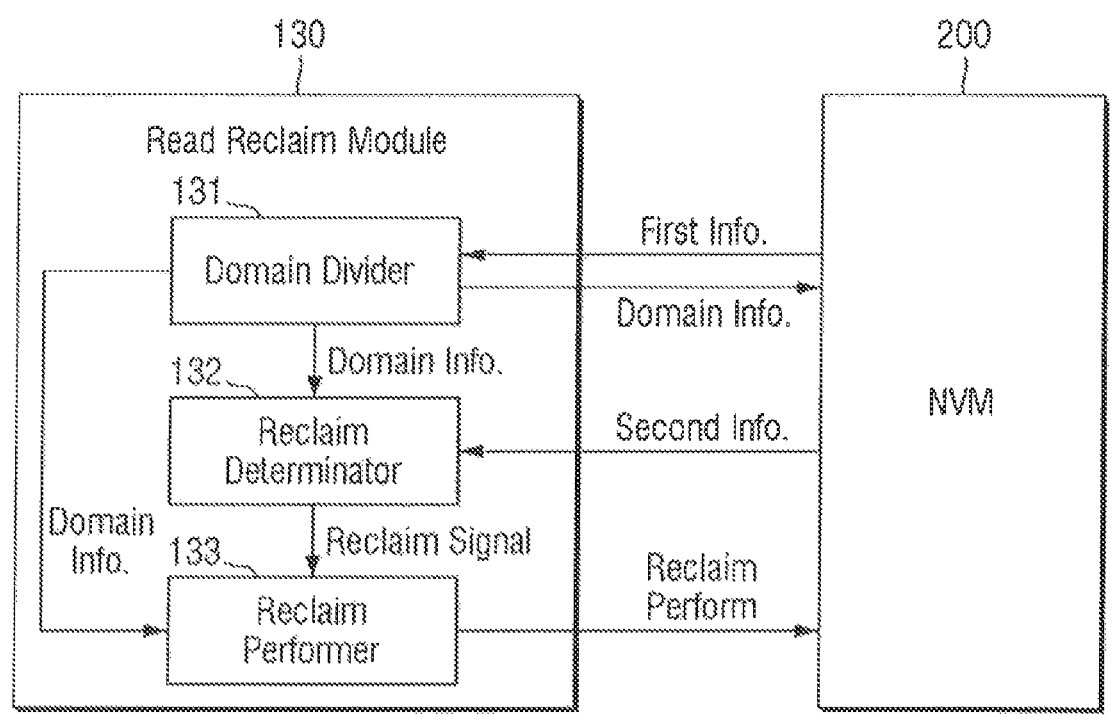
FIG. 3 is a detailed block diagram of a read reclaim module of the memory device according to the embodiment of FIG. 1.
Figure 4:
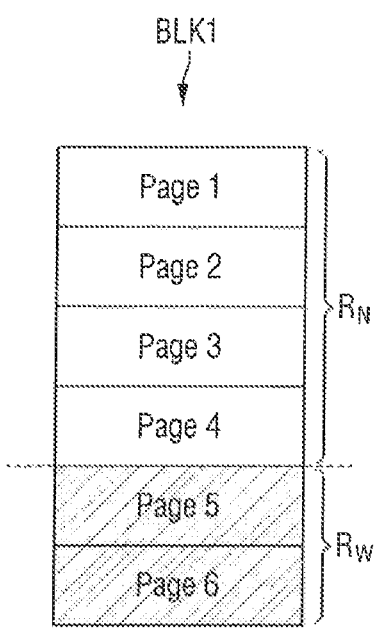
FIG. 4 is a diagram illustrating the division of a block of the memory device according to the embodiment of FIG. 1.
Figure 5:
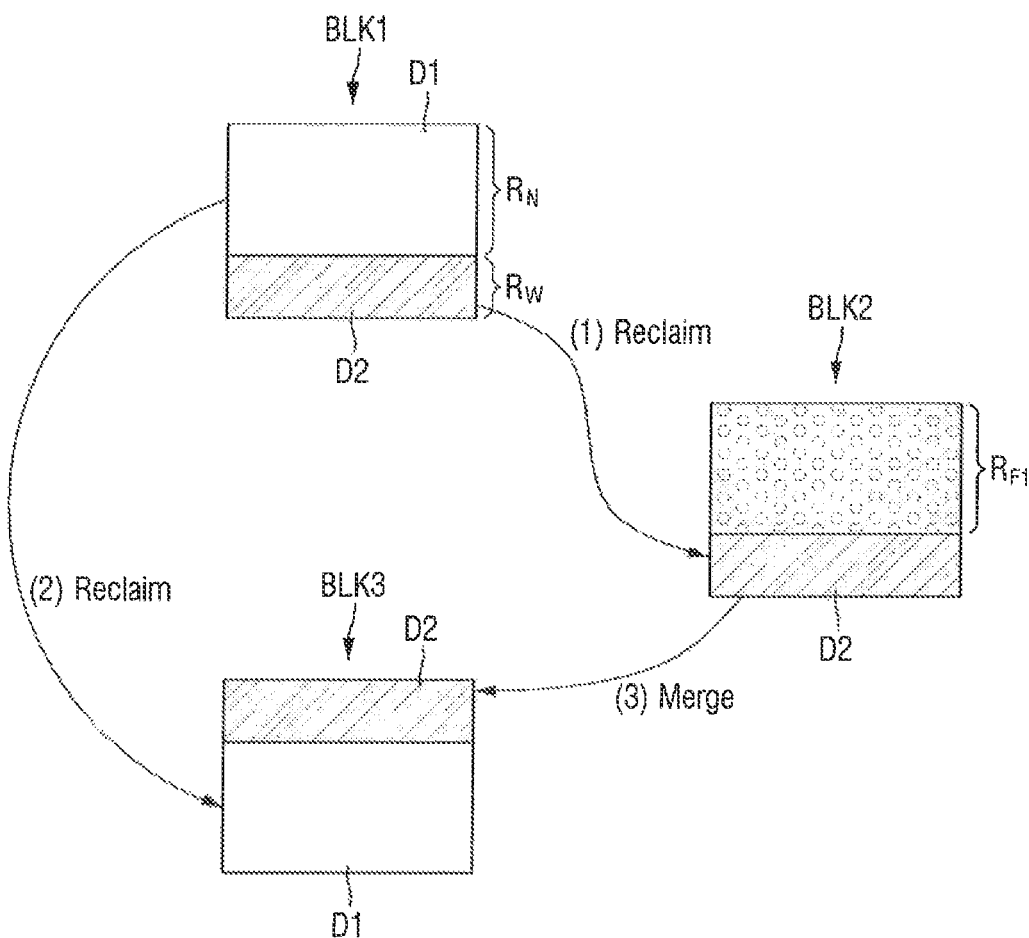
FIG. 5 is a conceptual diagram illustrating a reclaim operation of the memory device according to the embodiment of FIG. 1.
Figure 11:
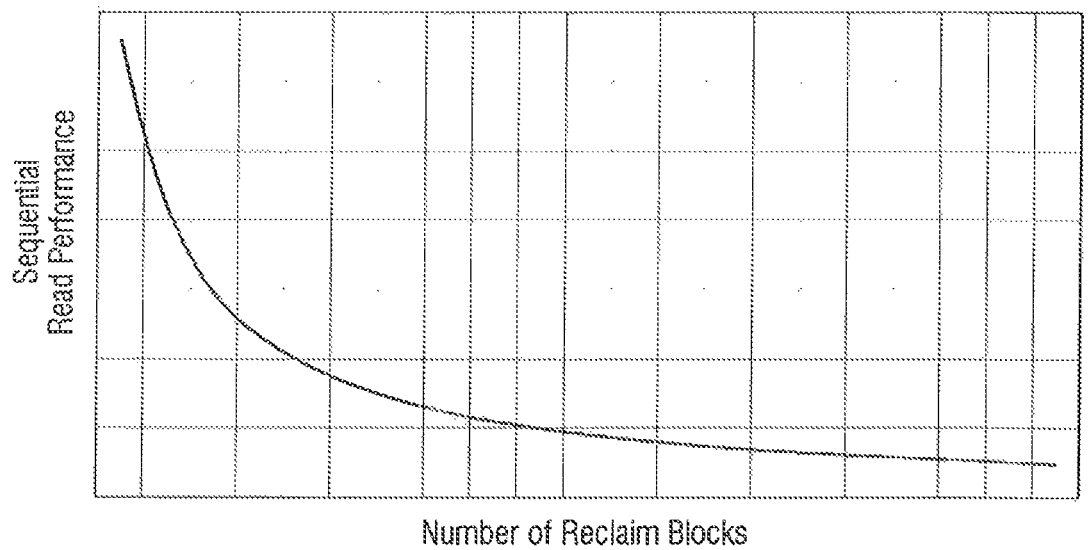
FIG. 11 is a graph of the change in sequential read performance of a memory device with respect to the number of reclaim blocks.
Figure 12:
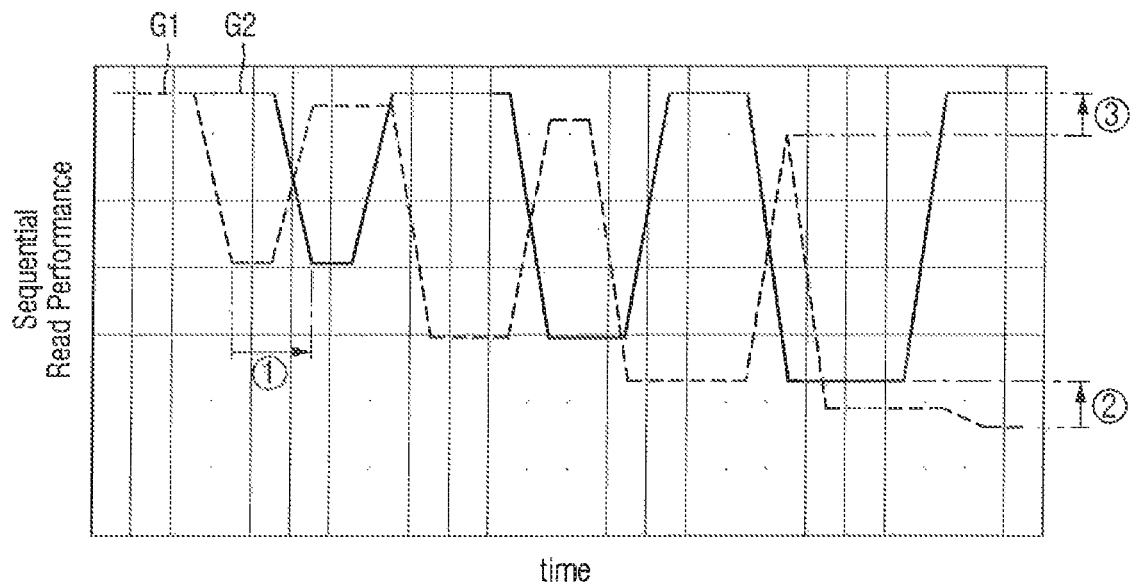
FIG. 12 is a graph of sequential read performance versus time of the memory device according to the embodiment of FIG. 1.

FIG. 1 is a block diagram of a memory device 1000 according to an exemplary embodiment of the inventive concept. FIG. 2 is a block diagram of the memory device 1000 according to the embodiment of FIG. 1. FIG. 3 is a detailed block diagram of a read reclaim module 130 of the memory device 1000 according to the embodiment of FIG. 1. FIG. 4 is a diagram illustrating the division of a block of the memory device 1000 according to the embodiment of FIG. 1. FIG. 5 is a conceptual diagram illustrating a reclaim operation of the memory device 1000 according to the embodiment of FIG. 1. FIGS. 6 through 10 are diagrams illustrating steps of the reclaim operation of the memory device 1000 according to the embodiment of FIG. 1. FIG. 11 is a graph of the change in sequential read performance of a memory device with respect to the number of reclaim blocks. FIG. 12 is a graph of sequential read performance versus time of the memory device 1000 according to the embodiment of FIG. 1.

In an embodiment, the read reclaim module 130 is implemented by microprocessor including a first processor or logic circuit that implements the domain divider 131, a second processor or logic circuit that implements the reclaim determinator 132, and a third processor or logic circuit that implements the reclaim performer 133. In another embodiment, the read reclaim module 130 is software executed by the processor 110 that includes a first function that implements the reclaim determinator 132, a second function that implements the reclaim determinator 132, and a third function that implements the reclaim performer 133. In another embodiment, the read reclaim module 130 is implemented by microprocessor that implements all the functions of domain divider 131, the reclaim determinator 132, and the reclaim performer 133.

Referring to FIGS. 1 and 2, the memory device 1000 includes a memory controller 100 and a nonvolatile memory 200.

The nonvolatile memory 200 may be, for example, a flash memory, a phase change random access memory (PRAM), a ferroelectric RAM (FRAM), or a magnetic RAM (MRAM).

The nonvolatile memory 200 may be replaced by a memory including a mixture of at least one nonvolatile memory device and at least one volatile memory device. The nonvolatile memory 200 may include a mixture of at least two different types of nonvolatile memory devices.

In an embodiment, the nonvolatile memory 200 is implemented by a single flash chip.

In an alternative embodiment, the nonvolatile memory 200 is implemented by a plurality of flash memory chips.

The memory controller 100 includes a processor 110, an error check & correction (ECC) module 120, the read reclaim module 130, a RAM 140, a host interface 150, a memory interface 160, and a bus 170. In an embodiment, the ECC module 120 is implemented by a circuit (e.g., an ECC circuit).

In an embodiment, the processor 110 is electrically connected to the ECC module 120, the read reclaim module 130, the RAM 140, the host interface 150 and the memory interface 160 via the bus 170.

The bus 170 is a transmission path for transmitting information between the elements of the memory controller 100. For example, the bus 170 may be implemented as at least one of a peripheral component interconnect (PCI) bus, a PCI express (PCIe) bus, an advanced microcontroller bus architecture (AMBA) bus, an advanced high performance (AHB) bus, an advanced extensible interface (AXI) bus, or any combination of these buses.

The processor 110 controls the overall operation of the memory device 1000.

Specifically, the processor 110 decrypts a command received from a host and controls the memory device 1000 to perform an operation according to the decrypted command.

The processor 110 provides a read command and a read address to the nonvolatile memory 200 during a read operation. The read address is the location in the nonvolatile memory 200 to read data in response to the read command. The processor 110 provides a write command, a write address and a code word to the nonvolatile memory 200 during a write operation. The write address is the location in the nonvolatile memory 200 to write the code word in response to the write command. In an embodiment, the code word is encoded or encrypted. In an embodiment, the processor 110 converts a logical address received from the host into a physical page address by using metadata stored in the RAM 140. The read address or the write address may include the logical address.

The RAM 140 temporarily stores data transmitted from the host and data generated by the processor 110 or temporarily stores data read from the nonvolatile memory 200. The RAM 140 may also store metadata read from the nonvolatile memory 200 and store information necessary for encoding or decoding. The RAM 140 may be implemented by a dynamic random access memory (DRAM) or a static random access memory (SRAM).

Metadata is information generated by the memory device 1000 in order to manage the nonvolatile memory 200. The metadata, which is management information, includes mapping table information used to convert a logical address into a physical page address of the nonvolatile memory 200. In an example, the metadata include page mapping table information necessary for performing address mapping on a page-by-page basis. In addition, the metadata may include information necessary for managing the storage space of the nonvolatile memory 200.

The host interface 150 has a data exchange protocol with the host connected to the nonvolatile memory 200 and interconnects the nonvolatile memory 200 and the host. The host interface 150 may be implemented as, but is not limited to, an advanced technology attachment (ATA) interface, a serial advanced technology attachment (SATA) interface, a parallel advanced technology attachment (PATA) interface, a universal serial bus (USB) or serial attached small computer system (SAS) interface, a small computer system interface (SCSI), an embedded multimedia card (eMMC) interface, a unix file system (UFS) interface, a peripheral component interconnect express (PCIe) interface, or a nonvolatile memory express (NVMe). Specifically, the host interface 150 may exchange commands, addresses and data with the host under the control of the processor 110.

The memory interface 160 is electrically connected to the nonvolatile memory 200.

The memory interface 160 may be configured to support interfacing with a NAND flash memory chip or a NOR flash memory chip. The memory interface 160 may be configured to selectively perform software and hardware interleaving operations through a plurality of channels.

In an exemplary embodiment, then power is supplied to the memory device 1000, the processor 110 controls the memory device 1000 to read metadata and information necessary for encoding or decoding from the nonvolatile memory 200 and to store the read metadata and information in the RAM 140. The processor 110 controls the memory device 1000 to update the metadata stored in the RAM 140 in response to an operation that causes a change in the metadata stored in the nonvolatile memory 200. In addition, the processor 110 controls the memory device 1000 to write the metadata stored in the RAM 140 to the nonvolatile memory 200 before the memory device 1000 is powered off.

In a write operation, the processor 110 controls the memory controller 100 to encode an information word received from the host according to an encoding method. In a read operation, the processor 110 controls the memory controller 100 to decode data read from the nonvolatile memory 200 according to a decoding method.

In an embodiment, the ECC module 120 generates an error correction code for data to be stored in the nonvolatile memory 200. The ECC module 120 may detect an error in data read from the nonvolatile memory 200 based on the error correction code and correct the detected error.

In an exemplary embodiment, the read reclaim module 130 decodes data read from the nonvolatile memory 200 according to a polar code decoding method, which will be described in more detail below.

The nonvolatile memory 200 of the memory device 1000 may include, but is not limited to, a plurality of flash memory chips 201 and 203.

The memory device 1000 may have N (N is a natural number) channels CH1 through CHN and a plurality of flash memory chips 201 or 203 for each of the channels CH1 through CHN. The number of the flash memory chips 201 or 203 for each of the channels CH1 through CHN may be set variously.

Referring to FIG. 2, each of the flash memory chips 201 and 203 may include a plurality of blocks BLK1 through BLKZ. In addition, each of the blocks BLK1 through BLKZ may include a plurality of pages Page1 through Pagem.

Referring to FIGS. 2 and 3, the read reclaim module 130 includes a domain divider 131, a reclaim determinator 132, and a reclaim performer 133.

The domain divider 131 receives first information from the nonvolatile memory 200.

The domain divider 131 divides each of the blocks BLK1 through BLKZ of the nonvolatile memory 200 into two domains by using the first information. For example, the dividing could result in some of the pages of the first block BLK being part of the first domain and the rest of the pages being part of the second domain.

In an embodiment, the two domains include a domain where the reliability of data is low and a domain where the reliability of data is not low. That is, the domain divider 131 distinguishes a domain where the reliability of data is low from a domain where the reliability of data is not low. For example, a reliability of one of the two domains is lower than a threshold and a reliability of the other of the two domains is >=the threshold.

The first information may include at least one of physical characteristics, read count, elapsed time after writing, and ECC information of each of the pages Page1 through Pagem of the nonvolatile memory 200.

Specifically, since the pages Page1 through Pagem of the nonvolatile memory 200 are located at different positions by separate word lines, their characteristics may be different at the different positions. Therefore, the domain divider 131 may receive information about the position of each of the pages Page 1 through Pagem from the nonvolatile memory 200.

In addition, the first information may include a read count indicating how many times a read operation has been performed on a specific page. The read count may be used to check the reliability of written data because the reliability of the written data decreases as the read count increases.

The first information may include information about how much time has elapsed since data was written to a specific page. Even if no particular read operation is performed after data has been written to the nonvolatile memory 200, the data stored in the nonvolatile memory 200 can naturally be lost due to the movement of charge. Therefore, in an embodiment of the inventive concept, the domain divider 131 checks how much time has elapsed since a write operation has been performed and refers to this information when dividing a block into domains.

In an exemplary embodiment, when the elapsed time since data was written to a given page exceeds a threshold time, the given page becomes part of the domain where reliability of data is low.

The first information may include ECC information. The ECC information may include the proportion of cells having errors in a specific area. That is, based on the ECC information of a specific area, the domain divider 131 can determine which part has low data reliability. For example, if the average page that has errors has one error, the current page being examined has three or more errors, and the proportion is 3, then the current page may be considered part of the domain where reliability of data is low.

The domain divider 131 may calculate a first score for each page of the nonvolatile memory 200 by combining various pieces of information included in the first information. The first score may be a criterion for determining the reliability of data.

A block division operation of the domain divider 131 will now be described with reference to FIGS. 3 and 4. In FIGS. 3 and 4, only the first block BLK1 will be described for the sake of convenience.

The first block BLK1 is illustrated as including first through sixth pages Page1 through Page6. However, the number of pages is not limited to six. That is, the number of pages can be less than six or more than six.

The domain divider 131 divides the first block BLK1 into a normal domain $R_N$ and a weak domain $R_W$ based on the first information. For example, some of the pages of the first block BLK1 are assigned to the normal domain $R_N$ and the rest are assigned to the weak domain $R_W$.

In an embodiment, the normal domain $R_N$ is a domain where the reliability of written data is not low, and the weak domain $R_W$ is a domain where the reliability of written data is low. In an embodiment, the domain divider 131 calculates the first score for each of the first through sixth pages Page1 through Page6 based on the first information and compares the first score with a preset first reference score to define the normal domain $R_N$ and the weak domain $R_W$. For example, if the first score for a given page is below the preset first reference score, the given page can be assigned to the normal domain $R_N$ and otherwise the given page can be assigned to the weak domain $R_W$.

In FIG. 4, the first through fourth pages Page1 through Page4 belong to the normal domain $R_N$, and the fifth and sixth pages Page5 and Page6 belong to the weak domain $R_W$.

Referring back to FIGS. 2 through 4, the domain divider 131 may transmit domain information including information about domains of each of the blocks BLK1 through BLKZ to the nonvolatile memory 200. In addition, the domain divider 131 may transmit the domain information to the reclaim determinator 132 and the reclaim performer 133.

The reclaim determinator 132 may receive second information from the nonvolatile memory 200. In an exemplary embodiment, the reclaim determinator 132 determines which part of the nonvolatile memory 200 will be reclaimed based on the second information.

Reclaiming could be performed on a block-by-block basis. That is, when any one of a plurality of pages in a block needs to be reclaimed, the entire block is reclaimed.

In an exemplary embodiment of the inventive concept, "reclaiming" denotes moving valid data in an area such as a block to another area such as a new free block. Reclaiming can prevent the reliability of valid data from being lowered.

Whether to perform reclaiming may be determined by the reclaim determinator 132. In an embodiment, the reclaim determinator 132 calculates a second score by using the second information. The second score may be a measure of the need to perform reclaiming.

The second information may include at least one of ECC information, dispersion information, structural characteristics, an input/output flow, and external stress.

Specifically, the second information may include ECC information, that is, information about the proportion of cells having errors in a specific area of the nonvolatile memory 200. A page or block having many errors may have a greater need for data reclaiming.

The second information may include dispersion information. In an embodiment, the dispersion information denotes a cell count according to the voltage of each cell of the nonvolatile memory 200. As the operation of each cell is repeated, a read level should be adjusted. Here, the need for reclaiming may vary according to the degree of adjustment of the read level. That is, a cell or page whose read level should be adjusted more may have a higher need for reclaiming. For example, a page whose read level is adjusted a number of times greater than a certain threshold during a given period may need to be reclaimed.

The second information may include structural characteristics information of the nonvolatile memory 200. That is, the second information may include position information of a word line corresponding to each of the pages Page 1 through Pagem of the nonvolatile memory 200. In other words, in a 3D flash memory, a threshold voltage of a cell close to a ground select line (GSL) and a threshold voltage of a cell close to a string select line (SSL) may be different. This may be because the cells of the 3D flash memory are connected in series. That is, due to such structural characteristics of the nonvolatile memory 200, a page located at a particular position may have a higher need for reclaiming. For example, the threshold voltage of a page or cell may be used to determine its position, and the position may be used to determine the page or cell needs to be reclaimed.

The second information may also include information about an input/output flow such as a read count and a write time. Since the reliability of data written to a page changes according to the input/output flow, the need for reclaiming may also change.

The second information may also include information about external stress. For example, the second information may include information about cell temperature. Since the reliability of data changes according to temperature, the need for reclaiming may also change. For example, if the cell temperature of a given page is greater than a threshold temperature, it may be necessary to reclaim the given page.

The second information may be similar to the first information. However, the second information need not be exactly the same as the first information. The first information may be information optimized for calculating the first score, and the second information may be information optimized for calculating the second score. Therefore, the first information and the second information may be generated according to the format required by the domain divider 131 and the reclaim determinator 132.

The reclaim determinator 132 may calculate the second score by comprehensively considering information included in the second information. The reclaim determinator 132 may determine whether to perform reclaiming by comparing the second score with a preset second reference score.

Basically, the reclaim determinator 132 determines whether to perform reclaiming for each of the blocks BLK1 through BLKZ. However, the reclaim determinator 132 may determine whether to perform reclaiming for each of the normal domain $R_N$ and the weak domain $R_W$ by referring to the domain information received from the domain divider 131.

In an embodiment, the reclaim determinator 132 determines whether to perform reclaiming for each of the normal domain $R_N$ and the weak domain $R_W$ and transmits a reclaim signal to the reclaim performer 133 when reclaiming is required.

The reclaim performer 133 receives the reclaim signal and the domain information.

The reclaim performer 133 may perform reclaiming on the nonvolatile memory 200 by using the reclaim signal and the domain information.

Specifically, referring to FIGS. 3 and 5, it is assumed that the first block BLK1 has written data and that the second block BLK2 and the third block BLK3 are free blocks.

The first block BLK1 is divided into the normal domain $R_N$ and the weak domain $R_W$ by the domain divider 131. First data D1 is stored in the normal domain $R_N$, and second data D2 is stored in the weak domain $R_W$.

When the reclaim determinator 132 determines it is to reclaim the weak domain $R_W$, the second data D2 is transferred to the second block BLK2 by the reclaim performer 133. In an embodiment, the reclaim signal identifies a block number and which of the weak and/or normal domains of the corresponding block is to be reclaimed. For example, since here the reclaim determinator 132 determines that the weak domain $R_W$ of the first block is to be reclaimed, the reclaim signal identifies block number one and the weak domain $R_W$. Since the second block BLK2 is originally a free block, a domain of the second block BLK2 excluding a domain where the second data D2 is present becomes a first free domain RF1 ((1) reclaim).

Next, when the reclaim determinator 132 determines it is to reclaim the normal domain $R_N$, the first data D1 is transferred to the third block BLK3 by the reclaim performer 133 ((2) reclaim). In an embodiment, the reclaim determinator 132 determines whether it is to reclaim the normal domain $R_N$ after the reclaiming of the weak domain $R_W$ has already been performed.

The first data D1 and the second data D2 are merged together when the second data D2 is transferred from the second block BLK2 to the third block BLK3 where the first data D1 is located ((3) merge).

Since the first score and the second score are calculated similarly, although the weak domain $R_W$ is typically reclaimed before the normal domain $R_N$, in an exemplary embodiment, the normal domain $R_N$ is reclaimed before the weak domain $R_W$. This is possible because the first score and the second score are not exactly the same. Even in this case, data in a domain reclaimed first and data in a domain reclaimed later may be transferred to different free blocks. Then, the data transferred to the two free blocks may be merged into one free block.

Therefore, fragmentation of the first data D1 and the second data D2 can be prevented. In other words, if continuous data exists at different positions, a problem can occur in a read operation. Therefore, the continuous data can be merged into one block to prevent the problem during the read operation.

In an exemplary embodiment of the inventive concept, the reclaim performer 133 reorders the first data D1 and the second data D2 when merging the first data D1 and the second data D2 into the third block BLK3. That is, the arrangement of the first data D1 and the second data D2 in the third block BLK3 are different from the arrangement of the first data D1 and the second data D2 in the first block BLK1. The reordering may also occur as a result of the prior reclaims. For example, as shown in FIG. 5, the reclaim of the normal region $R_N$ copies data from first locations of the first block BLK1 to second locations of the third block BLK that are higher than the corresponding first locations, thereby leaving space for the data of the weak region $R_W$ in a lower location that results in the reordering.

This is because the first and second scores determined by the physical and structural characteristics of the nonvolatile memory 200 can be differentiated in the same direction if the arrangement of the first data D1 and the second data D2 is the same in the first block BLK1 and the third block BLK3. In other words, the difference between the normal domain $R_N$ having a relatively high reliability and the weak domain $R_W$ having a relatively low reliability can increase.

To prevent this problem, in an exemplary embodiment, the reclaim performer 133 makes the arrangement of the first data D1 and the second data D2 in the third block BLK3 different from the arrangement of the first data D1 and the second data D2 in the first block BLK1.

The reclaim operation will now be described in more detail with reference to FIGS. 3 and 6 through 10.

Figure 6:
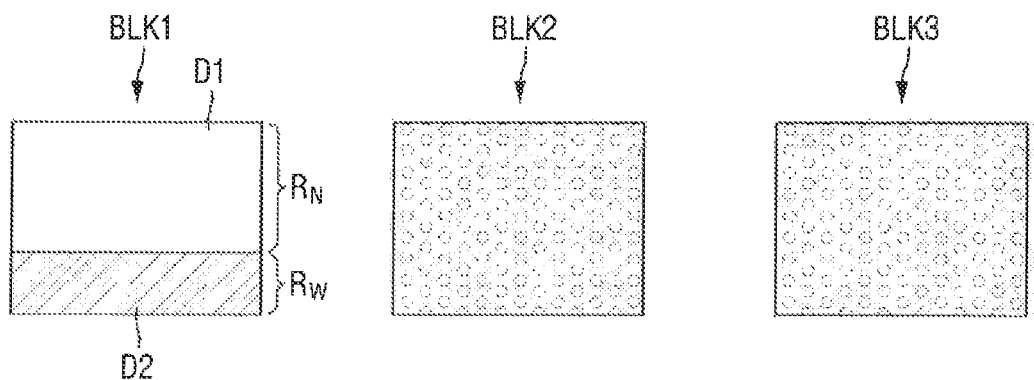
FIGS. 6 through 10 are diagrams illustrating steps of the reclaim operation of the memory device according to the embodiment of FIG. 1.

Referring to FIGS. 3 and 6, it is assumed that the first block BLK1 has written data and that the second block BLK2 and the third block BLK3 are free blocks.

The domain divider 131 divides the first block BLK1 into the normal domain $R_N$ and the weak domain $R_W$. First data D1 is located in the normal domain $R_N$, and second data D2 may be located in the weak domain $R_W$.

Figure 7:
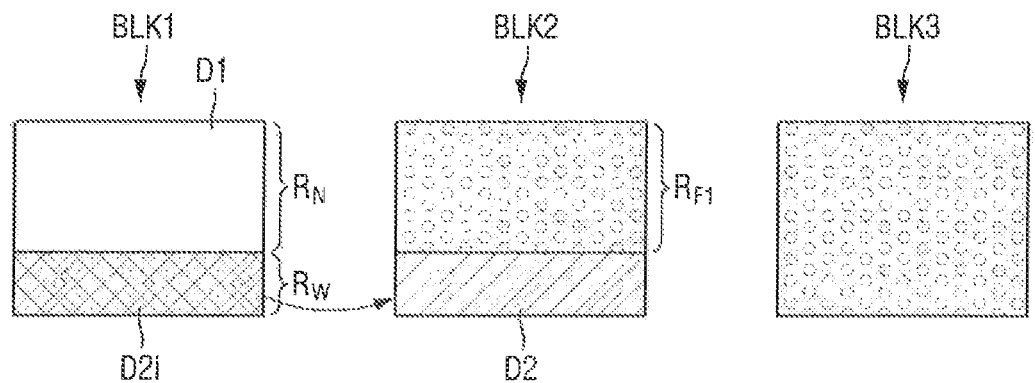

Referring to FIGS. 3 and 7, the reclaim determinator 132 determines it is to reclaim the weak domain $R_W$, and the reclaim performer 133 transfers the second data D2 to the second block BLK2. At this time, the second data D2 is copied to the second block BLK2, and the second data D2 in the weak domain $R_W$ of the first block BLK1 becomes second invalid data D2i.

The second invalid data D2i may be the second data D2 rendered invalid. The term "invalid" may denote a state in which data is not completely removed but cannot be read. For example, a mapping table including a logical address mapped to a physical address of the weak domain $R_W$ of the first block BLK1 may be updated so that it is mapped to a physical address of the second block BLK2 storing the second data D2. Since the logical address is no longer mapped to the physical address of the weak domain $R_W$ of the first block BLK1, the second data D2i cannot be read.

The second block BLK2 includes a first free domain $R_{F1}$ excluding a domain where the second data D2 is located. The third block BLK3 is a free block without any data yet.

Figure 8:
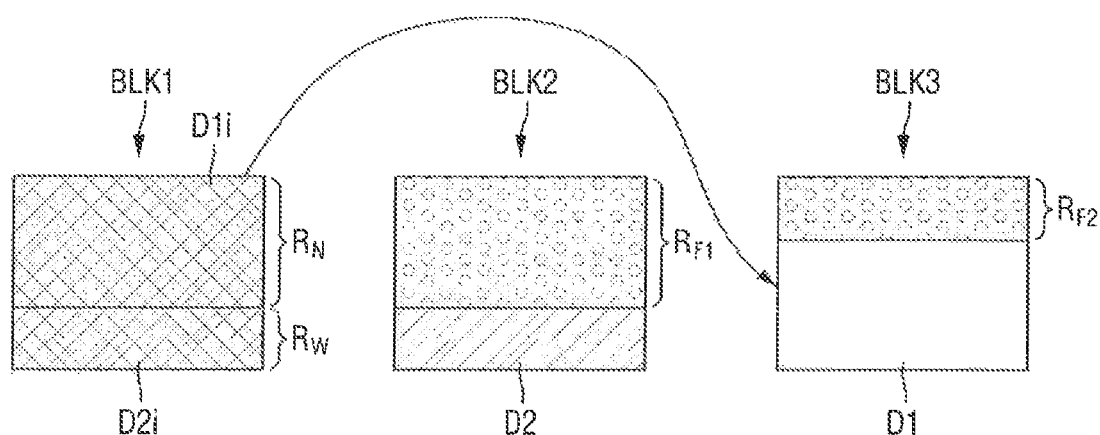

Referring to FIGS. 3 and 8, the reclaim determinator 132 determines it is to reclaim the normal domain $R_N$, and the reclaim performer 133 transfers the first data D1 to the third block BLK3. In an embodiment, the reclaim determinator 132 performs this determination after the second data D2 has been copied to the second block BLK2. At this time, the first data D1 is copied to the third block BLK3, and the first data D1 in the normal domain $R_N$ of the first block BLK1 becomes first invalid data D1i. The first invalid data D1i may be the first data D1 rendered invalid. For example, a mapping table including a logical address mapped to a physical address of the normal domain $R_N$ of the first block BLK1 may be updated so that it is mapped to a physical address of the third block BLK3 storing the first data D1. Since the logical address is no longer mapped to the physical address of the normal domain $R_N$ of the first block BLK1, the first data D1i cannot be read.

The third block BLK3 includes a second free domain $R_{F2}$ excluding a domain where the first data D1 is located. The second block BLK2 stills include the second data D2 and the first free domain $R_{F1}$.

Figure 9:
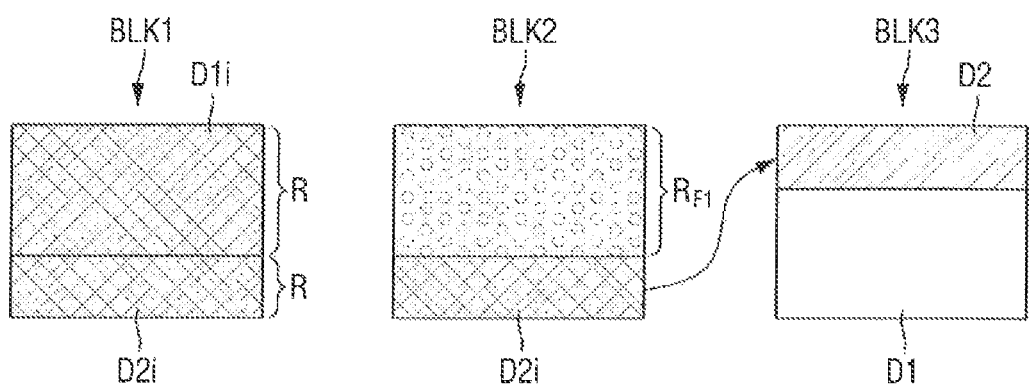

Referring to FIGS. 3 and 9, the reclaim performer 133 transfers the second data D2 of the second block BLK2 to the third block BLK3. Specifically, the second data D2 of the second block BLK2 is copied to the third block BLK3, and the second data D2 in the second block BLK2 becomes the second invalid data D2i. That is, the second data D2 is rendered invalid within the second block BLK2.

In the third block BLK3, the first data D1 and the second data D2 are reordered. In other words, the first data D1 and the second data D2 are arranged in the third block BLK3 at different positions from their positions in the first block BLK1. Here, only the order of the first data D1 and the second data D2 is illustrated as being changed, but addresses of internal data can also be reordered irregularly.

Figure 10:
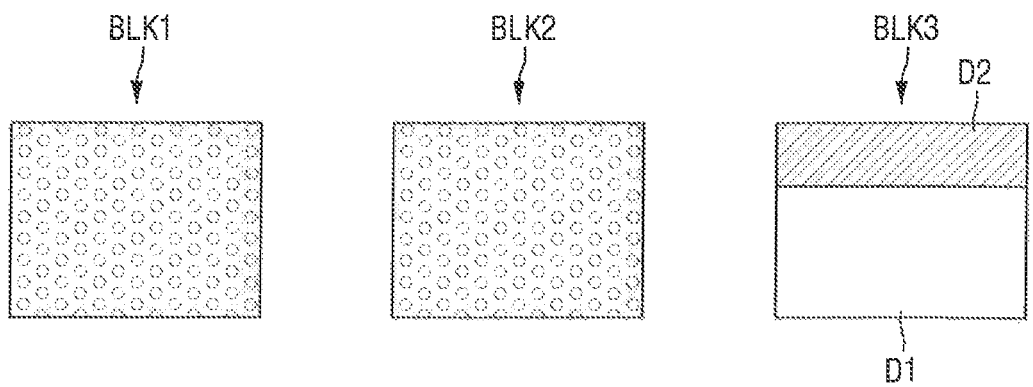

Referring to FIG. 10, the first invalid data D1i and the second invalid data D2i of the first block BLK1 and the second invalid data D2i of the second block BLK2 are removed. For example, one or more delete operations may be performed on the first and second blocks BLK1 and BLK2. Accordingly, the first block BLK1 and the second block BLK2 become free blocks.

The removal of the invalid data does not need to be performed after a reclaim operation. That is, when the time to remove invalid data from the memory device 1000 comes, the invalid data may all be removed even during the reclaim operation. That is, the removal of invalid data can be performed independently of the reclaim operation.

Referring to FIG. 11, memory devices including the memory device 1000 according to the embodiment of FIG. 1 may have lower sequential read performance as the number of reclaim blocks increases. Therefore, minimizing the number of reclaim blocks may be one way to improve the sustain performance of a memory device.

The effects of the memory device 1000 according to the embodiment of FIG. 1 will now be described with reference to FIG. 12.

In FIG. 12, the sequential read performance versus time of a conventional memory device is represented by G1, and the sequential read performance versus time of the memory device 1000 according to the embodiment of FIG. 1 is represented by G2. G1 and G2 are approximate graphs for explaining a tendency.

Referring to G1, the sequential read performance of the conventional memory device may deteriorate during reclaiming. That is, the sequential read performance may deteriorate as a cost of the reclaim operation.

In addition, the sequential read performance may deteriorate longer and more as the number of reclaim operations increases. Furthermore, as the number of reclaim operations increases, it may not be possible to completely recover from a decrease in the sequential read performance due to a reclaim operation. Accordingly, a maximum value of the sequential read performance may be lowered.

That is, since reclaiming is performed on a block-by-block basis in the conventional memory device, it may be performed based on the most inferior page within a block. Therefore, data of pages that do not need to be reclaimed are reclaimed, thereby unnecessarily increasing the overall frequency of reclaiming.

Moreover, as the number of pages included in one block increases and the density of space increases, characteristics of pages in each block may gradually become more different from each other. This may increase the execution of unnecessary reclaiming.

On the other hand, the memory device 1000 according to the embodiment of FIG. 1 determines whether to perform reclaiming for each of the weak domain $R_W$, which is reclaimed relatively frequently, and the normal domain $R_N$. Therefore, the normal domain $R_N$ may be reclaimed at a later time, which can decrease the overall reduction in performance due to reclaiming (①).

Furthermore, since the weak domain $R_W$ and the normal domain $R_N$ are reclaimed separately, a decrease in sequential read performance due to a reclaim operation can be reduced. That is, since a decrease in sequential read performance due to one reclaim operation is small, a minimum value of the sequential read performance can be guaranteed to be equal to or higher than a specific reference value.

The minimum value of the sequential read performance is an important evaluation factor for evaluating the performance of the memory device 1000 in various operations. Therefore, the overall performance of the memory device 1000 can be improved by increasing the minimum value of the sequential read performance (②).

In addition, since the weak domain $R_W$ and the normal domain $R_N$ are separated from each other, unnecessary reclaiming of the normal domain $R_N$ can be reduced. Accordingly, the timing of incomplete recovery of the sequential read performance due to the repetition of reclaiming can be delayed, which, in turn, delays a decrease in the maximum value of the sequential read performance as much as possible (③).

If a domain is designated as the weak domain $R_W$ at least once, the memory device 1000 according to the at least one embodiment of the inventive concept can reduce a gap in characteristics change between the weak domain $R_W$ and the normal domain $R_N$ by converting characteristics of a physical address through reordering during reclaiming. That is, since the weak domain $R_W$ and the normal domain $R_N$ can be redefined by a different criterion after reclaiming, the risk of data loss can be spread.

A memory device according to an exemplary embodiment of the inventive concept will now be described with reference to FIGS. 1 through 3, 5 and 13. A redundant description of elements and features identical to those of the above-described embodiments will be simplified or omitted.

Figure 13:
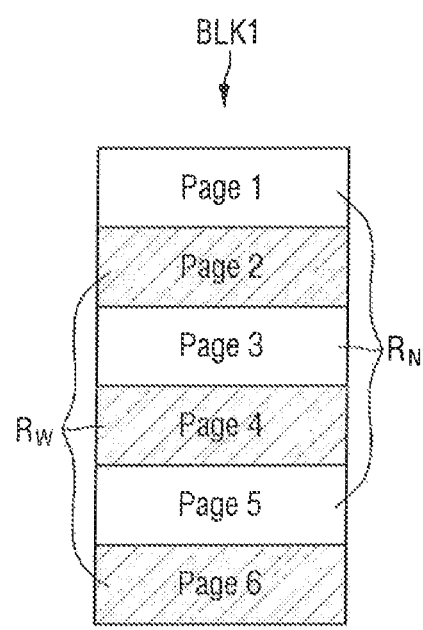
FIG. 13 is a diagram illustrating the division of a block of a memory device according to an exemplary embodiment of the inventive concept.

FIG. 13 is a diagram illustrating the division of a block of a memory device according to an exemplary embodiment of the inventive concept.

Referring to FIGS. 1 through 3, 5 and 13, a domain divider 131 divides a first block BLK1 into a normal domain $R_N$ and a weak domain $R_W$. Here, each of the normal domain $R_N$ and the weak domain $R_W$ may be a set of a plurality of areas separated from each other.

For example, as illustrated in FIG. 13, the normal domain $R_N$ is first, third and fifth pages Page 1, Page 3 and Page 5, and the weak domain $R_W$ is second, fourth and sixth pages Page 2, Page 4 and Page 6. That is, a physical address of the normal domain $R_N$ may be discontinuous, and a physical address of the weak domain $R_W$ may also be discontinuous.

This may be because the domain divider 131 determines a first score for each page.

Therefore, in (3) merge of FIG. 5, data located in the first through sixth pages Page1 through Page6 is reordered in a third block BLK3. At this time, the order of first data D1 and second data D2 is not changed. Instead, the pages Page1 through Page6 are reordered.

Accordingly, data belonging to the weak domain $R_W$ and the normal domain $R_N$ are reordered, thereby preventing a steady decline in the reliability of specific data.

A memory device according to an exemplary embodiment of the inventive concept will now be described with reference to FIGS. 1 through 4 and 14. A redundant description of elements and features identical to those of the above-described embodiments will be simplified or omitted.

Figure 14:
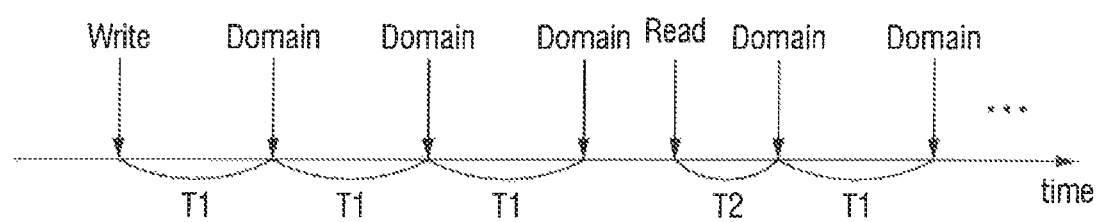
FIG. 14 is a time diagram illustrating a reclaim operation of a memory device according to an exemplary embodiment of the inventive concept.

FIG. 14 is a time diagram illustrating a reclaim operation of a memory device 1000 according to an exemplary embodiment of the inventive concept.

Referring to FIGS. 1 through 4 and 14, a domain divider 131 repeatedly performs a domain division operation. That is, after a write operation of a nonvolatile memory 200, the domain division operation is repeatedly performed.

Here, the domain division operation may be performed at regular intervals T1. That is, since first information includes information that varies with time, the contents of the first information may vary with time. Therefore, the domain divider 131 may receive the updated first information and perform a domain division operation by calculating a first score based on the updated first information.

Alternatively, the domain division operation may be performed after a read operation. That is, since information such as a read count of the first information can be changed in a read operation, the first information may be updated. Therefore, the domain divider 131 may perform a domain division operation a predetermined time T2 after a read operation.

The memory device 1000 according to an exemplary embodiment of the inventive concept may also perform a domain division operation on an irregular basis or perform a domain division operation in real time by receiving the first information in real time. Here. "real time" may refer to performing a domain division operation at every edge of a clock signal of a highest frequency in the memory device 1000.

The memory device 1000 according to at least one embodiment can perform the reclaiming efficiently by precisely dividing a block into a weak domain $R_W$ and a normal domain $R_N$. Accordingly, the read performance of the memory device 1000 can be dramatically improved.

A memory device according to an exemplary embodiment of the inventive concept will now be described with reference to FIGS. 1 through 4 and 15. A redundant description of elements and features identical to those of the above-described embodiments will be simplified or omitted.

Figure 15:
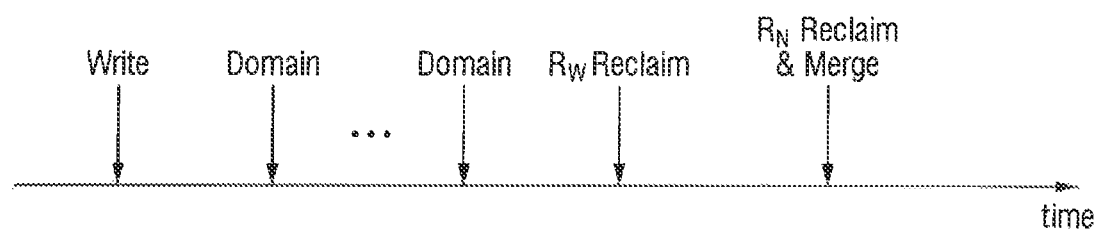
FIG. 15 is a time diagram illustrating a reclaim operation of a memory device according to an exemplary embodiment of the inventive concept.

FIG. 15 is a time diagram illustrating a reclaim operation of a memory device 1000 according to an exemplary embodiment of the inventive concept.

Referring to FIGS. 1 through 4 and 15, in the memory device 1000 according to an exemplary embodiment of the inventive concept, a domain divider 131 and a reclaim determinator 132 operate independently. That is, the domain divider 131 may continuously perform a domain division operation regardless of the determination and execution of reclaiming.

The reclaim determinator 132 may determine whether to perform reclaiming based on domain information and second information. The domain information and the second information may be continuously updated and kept up to date. That is, the reclaim determinator 132 may determine whether to reclaim each of a normal domain $R_N$ and a weak domain $R_W$ by using the latest updated domain information and second information.

When the reclaim determinator 132 determines it is to reclaim the weak domain $R_W$ first (because the weak domain $R_W$ is generally reclaimed first), a reclaim performer 133 reclaims the weak domain $R_W$. Then, when it is determined that the normal domain $R_N$ is to be reclaimed, the normal domain $R_N$ is reclaimed and then merged with the reclaimed weak domain $R_W$.

That is, the memory device 1000 according to at least one embodiment of the inventive concept can determine whether to perform reclaiming by using the latest updated domain information and second information and perform reclaiming. Accordingly, an efficient reclaim operation is possible.

A reclaiming method of a memory device according to an exemplary embodiment of the inventive concept will now be described with reference to FIGS. 1 through 3, 6 through 10 and 16. A redundant description of elements and features identical to those of the above-described embodiments will be simplified or omitted.

Figure 16:
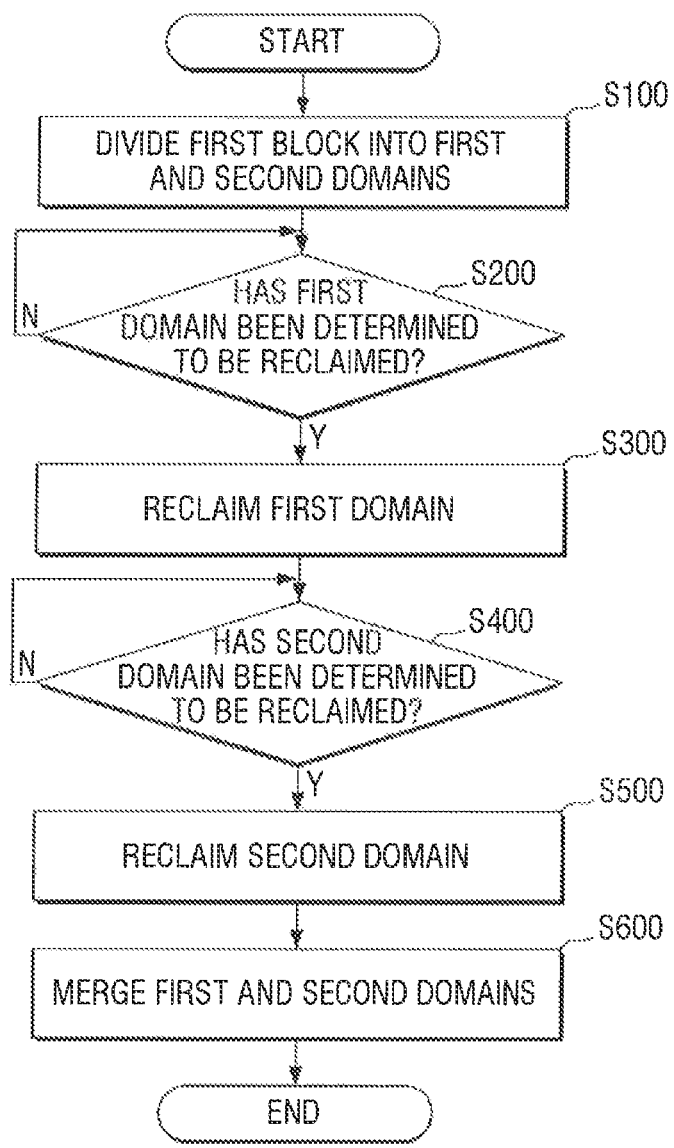
FIG. 16 is a flowchart illustrating a reclaiming method of a memory device according to an exemplary embodiment of the inventive concept.

FIG. 16 is a flowchart illustrating a reclaiming method of a memory device according to an exemplary embodiment of the inventive concept.

Referring to FIG. 16, a first block is divided into first and second domains (operation S100).

Specifically, referring to FIGS. 3 and 6, a domain divider 131 may divide a first block BLK1 into a normal domain $R_N$ and a weak domain $R_W$. That is, the first and second domains may be the weak domain $R_W$ and the normal domain $R_N$, respectively. Alternatively, the first and second domains may be the normal domain $R_N$ and the weak domain $R_W$, respectively.

First data D1 may be located in the normal domain $R_N$, and second data D2 may be located in the weak domain $R_W$. For ease of description, it will be assumed that the first block BLK1 has written data and that a second block BLK2 and a third block BLK3 are free blocks.

Referring back to FIG. 16, it is determined whether to reclaim the first domain (operation S200).

Specifically, referring to FIG. 3, a reclaim determinator 132 determines it should reclaim the weak domain $R_W$ first. It can be determined that the weak domain $R_W$ and the normal domain $R_N$ are to be simultaneously reclaimed. However, typically the weak domain $R_W$ is reclaimed first. In this case, the first domain is the weak domain $R_W$, and the normal domain $R_N$ is the second domain. However, when the normal domain $R_N$ is reclaimed first, the normal domain $R_N$ is the first domain, and the weak domain $R_W$ is the second domain.

The determining of whether to reclaim the first domain may include calculating a second score based on second information. If it is determined that reclaiming is necessary as a result of comparing the second score with a second reference score, the data of the first domain is reclaimed (operation S300). Otherwise, the determining of whether to reclaim the first domain is performed again.

Although operations S200 through S500 are sequentially illustrated in FIG. 16, embodiments of the inventive concept are not limited to this case. That is, even if operations S200 and S400 are performed simultaneously, since one of the two domains is determined first to be reclaimed, the domain determined first to be reclaimed may be defined as the first domain. For convenience, the following description will be made based on the assumption that the weak domain $R_W$ is the first domain, and the normal domain $R_N$ is the second domain.

Referring back to FIG. 16, the first domain is reclaimed (operation S300).

Specifically, referring to FIGS. 3 and 7, when the weak domain $R_W$ is determined to be reclaimed in operation S200, a reclaim performer 133 transfers the second data D2 to the second block BLK2. At this time, the second data D2 is copied to the second block BLK2, and the second data D2 of the weak domain $R_W$ of the first block BLK1 becomes second invalid data D2$i$.

The second block BLK2 may include a first free domain $R_{F1}$ excluding a domain where the second data D2 is located.

Referring back to FIG. 16, it is determined whether to reclaim the second domain (operation S400).

Specifically, referring to FIG. 3, the reclaim determinator 132 may determine whether to reclaim the normal domain $R_N$.

The determining of whether to reclaim the normal domain $R_N$ may include calculating the second score based on the second information. If it is determined that reclaiming is necessary as a result of comparing the second score with the second reference score, the data for the second domain is reclaimed (operation S500). Otherwise, the determining of whether to reclaim the normal domain $R_N$ is performed again.

Referring back to FIG. 16, the second domain is reclaimed (operation S500).

Specifically, referring to FIGS. 3 and 8, when the normal domain $R_N$ is determined to be reclaimed in operation S400, the reclaim performer 133 transfers the first data D1 from the first block BLK2 to the third block BLK3. At this time, the first data D1 is copied to the third block BLK3, and the first data D1 of the normal domain $R_N$ of the first block BLK1 becomes first invalid data D1$i$. The first invalid data D1$i$ may be the first data D1 rendered invalid.

The third block BLK3 may include a second free domain $R_{F2}$ excluding a domain where the first data D1 is located. The second block BLK2 may still include the second data D2 and the first free domain $R_{F1}$.

Referring back to FIG. 16, the first and second domains are merged (operation S600).

Even if any one of the weak domain $R_W$ and the normal domain $R_N$ is reclaimed first, the two domains are merged again.

Specifically, referring to FIGS. 3 and 9, the second data D2 of the second block BLK2 is transferred to the third block BLK3 by the reclaim performer 133. More specifically, the second data D2 of the second block BLK2 is copied to the third block BLK3, and the second data D2 in the second block BLK2 becomes the second invalid data D2$i$. That is, the second data D2 may be rendered invalid again.

In the third block BLK3, the first data D1 and the second data D2 are reordered. In other words, the first data D1 and the second data D2 are arranged in the third block BLK3 at different positions from their positions in the first block BLK1. Here, only the order of the first data D1 and the second data D2 are changed, but addresses of internal data can also be reordered irregularly.

Referring to FIG. 10, the first invalid data D1$i$ and the second invalid data D2$i$ of the first block BLK1 and the second invalid data D2$i$ of the second block BLK2 are removed. Accordingly, the first block BLK1 and the second block BLK2 all become free blocks. The removal of invalid data can be performed independently of a reclaim operation.

In an exemplary embodiment of the inventive concept, a reclaim is performed only with respect to part (e.g., a less reliable area or a weak region) of a block, a delay occurs, and then the reclaim is performed with respect to the rest of the block (e.g., a more reliable area or a normal region). In an embodiment, the larger the difference in reliability between the normal region and the weak region, the larger the delay. In an embodiment, the weak region is merged into a block that reclaims the normal region to main peak performance and to prevent fragmentation. In an embodiment, the reclaim is performed on the part of the block first to maintain interval reliability and performance. The performance trough at that point can be improved by the ratio of the weak region in the entire block as compared to when the entire block is reclaimed.

While the present inventive concept has been particularly shown and described with reference to exemplary embodiments thereof, it will be understood by those of ordinary skill in the art that various changes in form and details may be made therein without departing from the spirit and scope of the present inventive concept.

What is claimed is:

1. A memory device comprising:
   a nonvolatile memory comprising a first block; and
   a memory controller configured to exchange data with the nonvolatile memory,
   wherein the memory controller comprises:
      a first processor which divides the first block into first and second domains;
      a second processor which generates a reclaim signal by determining whether to perform reclaiming on each of the first and second domains; and
      a third processor which reclaims each of the first and second domains according to the reclaim signal and merges the first and second domains.

2. The memory device of claim 1, wherein the first block comprises a plurality of pages, and the first processor calculates a first score for each of the pages by using first information and assigns each of the pages to the first or second domain by comparing the first score with a preset first reference score.

3. The memory device of claim 2, wherein the first information comprises at least one of physical characteristics, read count, elapsed time after writing and error check & correction (ECC) information of each of the pages.

4. The memory device of claim 2, wherein the first processor updates the first information and newly divides the first block into the first and second domains using the updated first information.

5. The memory device of claim 1, wherein the third processor reorders the first and second domains when merging the first and second domains.

6. The memory device of claim 1, wherein the nonvolatile memory comprises a second block, the first processor divides the second block into third and fourth domains, the third processor generates a second reclaim signal by determining whether to perform reclaiming on each of the third and fourth domains, and the third processor reclaims at least one of the third and fourth domains according to the second reclaim signal and merges the third and fourth domains.

7. The memory device of claim 1, wherein the second processor generates a first score using first information and determines whether to perform the reclaiming by comparing the first score with a preset first reference score.

8. The memory device of claim 7, wherein the first information comprises at least one of ECC information, dispersion information, structural characteristics, an input/output flow, and external stress.

9. A memory device comprising:
   a nonvolatile memory comprising a first data block, a first free block and a second free block; and
   a memory controller configured to exchange data with the nonvolatile memory,
   wherein the memory controller divides the first block into first and second domains having first and second data, respectively, transfers the first data to the first free block, transfers the second data to the second free block, and merges the first and second data by transferring the first data to the second free block.

10. The memory device of claim 9, wherein a physical address of each of the first domain and the second domain is discontinuous.

11. The memory device of claim 9, wherein the transferring of the first data to the first free block comprises copying the first data to the first free block and marking the first data in the first block as invalid.

12. The memory device of claim 11, wherein the transferring of the second data to the second free block by the memory controller comprises copying the second data to the second free block and marking the second data in the second block as invalid.

13. The memory device of claim 11, wherein the memory controller determines whether to reclaim each of the first and second domains and transfers the first data when determining to reclaim the first domain.

14. The memory device of claim 13, wherein the second data is transferred when the memory controller determines it is to reclaim the second domain.

15. A reclaiming method of a memory device, the method comprising:
   dividing, by a first processor of a memory controller, a first block into first and second domains having first and second data, respectively;
   generating, by a second processor of the memory controller, a reclaim signal by determining whether to reclaim each of the first and second domains;
   reclaiming, by a third processor of the memory controller, the first domain according to the reclaim signal;
   reclaiming, by the memory controller, the second domain according to the reclaim signal; and
   merging, by the memory controller, the first domain and the second domain.

16. The method of claim 15, wherein the reclaiming of the first domain comprises the third processor copying the first data to a first free block and marking the first data in the first block as invalid.

17. The method of claim 16, wherein the reclaiming of the second domain comprises:
   copying, by the third processor, the second data from the first block to a second free block and marking the second data in the second domain as invalid; and
   copying, by the third processor, the first data of the first free block to the second domain and marking the first data in the first free block as invalid.

18. The method of claim 15, wherein the merging of the first domain and the second domain comprises merging the first and second data by reordering the first and second data.

19. The method of claim 15, wherein the dividing of the first block into the first and second domains is performed using first information, wherein the first information comprises at least one of physical characteristics, read count, elapsed time after writing and ECC information of each of a plurality of pages of the first block.

20. The method of claim 19, wherein the first information is updated periodically, and the first block is divided into the first and second domains based on the updated first information.

\* \* \* \* \*